(12) United States Patent
Chao et al.

(10) Patent No.: US 9,979,382 B1
(45) Date of Patent: May 22, 2018

(54) PROGRAMMABLE DUTY-CYCLE LOW JITTER DIFFERENTIAL CLOCK BUFFER

(71) Applicants: Yuan-Ju Chao, Cupertino, CA (US); Ta-Shun Chu, Hsunchu (TW)

(72) Inventors: Yuan-Ju Chao, Cupertino, CA (US); Ta-Shun Chu, Hsunchu (TW)

( * ) Notice: Subject to any disclaimer, the term of this patent is extended or adjusted under 35 U.S.C. 154(b) by 0 days. days.

(21) Appl. No.: 15/451,113

(22) Filed: Mar. 6, 2017

(51) Int. Cl.
*H03K 5/156* (2006.01)
*H03K 5/19* (2006.01)
*G11C 27/02* (2006.01)

(52) U.S. Cl.
CPC .......... *H03K 5/1565* (2013.01); *G11C 27/02* (2013.01); *H03K 5/19* (2013.01)

(58) Field of Classification Search
CPC ......... H03K 5/1565; H03K 5/19; G11C 27/02
See application file for complete search history.

(56) References Cited

U.S. PATENT DOCUMENTS 7,733,143 B2 * 6/2010 Guo .................... H03K 5/1565
327/172

* cited by examiner

*Primary Examiner* — Jung Kim
(74) *Attorney, Agent, or Firm* — Tran & Associates

(57) ABSTRACT

A method of detecting clock duty cycle and adjusting clock duty cycle to achieve a clock with low jitters, low noise, high common mode rejection and high power supply rejection for sampling circuit. Adjusting the duty cycle of the sampling clock can enhance data converter's performance.

10 Claims, 10 Drawing Sheets

PROGRAMMABLE DUTY-CYCLE LOW JITTER DIFFERENTIAL CLOCK BUFFER

BACKGROUND

Data converters are an essential element of the signal processing chain in today's system-on-a-chip (SoC) applications such as high-data-rate telecom systems or high-quality audio and video equipment. The sampling clock's quality is the key factor of the systems performance incorporating data converters. Uncertainty of the time instant (defined as a clock jitter) when the analog-to-digital converter (ADC) samples the signal increases noise, which degrades the overall system performance. The higher clock jitters, the lower SNR the signal processing system obtains. The theoretical maximum SNR imposed on ADC performance as a result of a specified sampling clock jitter can be described as the following equation:

$$SNR = 20\log\left[\frac{1}{2 fin T_j}\right]$$

fin is the input signal frequency
$T_j$ is the clock jitter

FIG. 1 illustrates a block diagram of today's typical system-on-a-chip (SoC) integrated circuit. A pair of differential clocks CKP/CKN is fed into SoC from a clock source externally. The signal amplitude of the input clock sources is usually quite small in order to achieve good linearity. A buffer is required to amplify the clock signal amplitude to a full rail-to-rail swing and also drive the large capacitance due the long routing path from the buffer to ADC or DAC. The clock needs to maintain specified characteristics such as low noise, low jitter, high common mode rejection and supply rejection during the amplification, otherwise ADC/DAC performance may be limited by the deteriorated clock.

Another important aspect of the clock is the duty cycle, which determines the time of active high and active low during one clock cycle. FIG. 2 shows a four-stage Pipelined ADC block diagram. Each stage either is executing sample function or gain function. The even stage and odd stages are alternating sample and gain function in order to gain data throughput. When the odd stages are performing sample function, the even stages are undertaking gain function. The active high time of clock is used for odd stages to perform sample function whereas the active low time is used for even stages to perform sample function. The duty cycle change the active time and affect data converter performance. For example, pipelined ADC linearity is often limited by the settling time of the first stage during gain function. Adjusting the duty cycle can obtain more time for first stage settling and improve linearity and associated performance.

SUMMARY

A programmable duty-cycle differential clock buffer consists of differential to single buffer, single-ended clock buffer, sampling circuit, duty cycle detection and duty cycle adjustment. These five function modules form a close loop with negative feedback mechanism.

Implementations of the above aspect can include one or more of the following. The small differential input clock signals are amplified gradually by the differential to single buffer to a squared wave without compromising the signal integrity. Duty cycle detection obtains the duty cycle information from the sampling circuit and passes it to duty cycle adjustment. Duty cycle adjustment introduce offset current to pre-amp stage inside the differential to single buffer, this results in a change of the duty cycle percentage. Furthermore, the duty cycle adjustment can be executed in continuous time method or discrete time method using ADC/DAC pair. The functional elements and applications that employ sampling circuit such as data converters (ADC, DAC) can gain performance improvement by adjusting and optimizing the duty cycle of the clock.

Advantages of the system may include one or more of the following. The programmable duty-cycle differential clock buffer addresses the issue and concerns of conventional clock buffers and enhances the data converter's performance.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION

Figure 1:
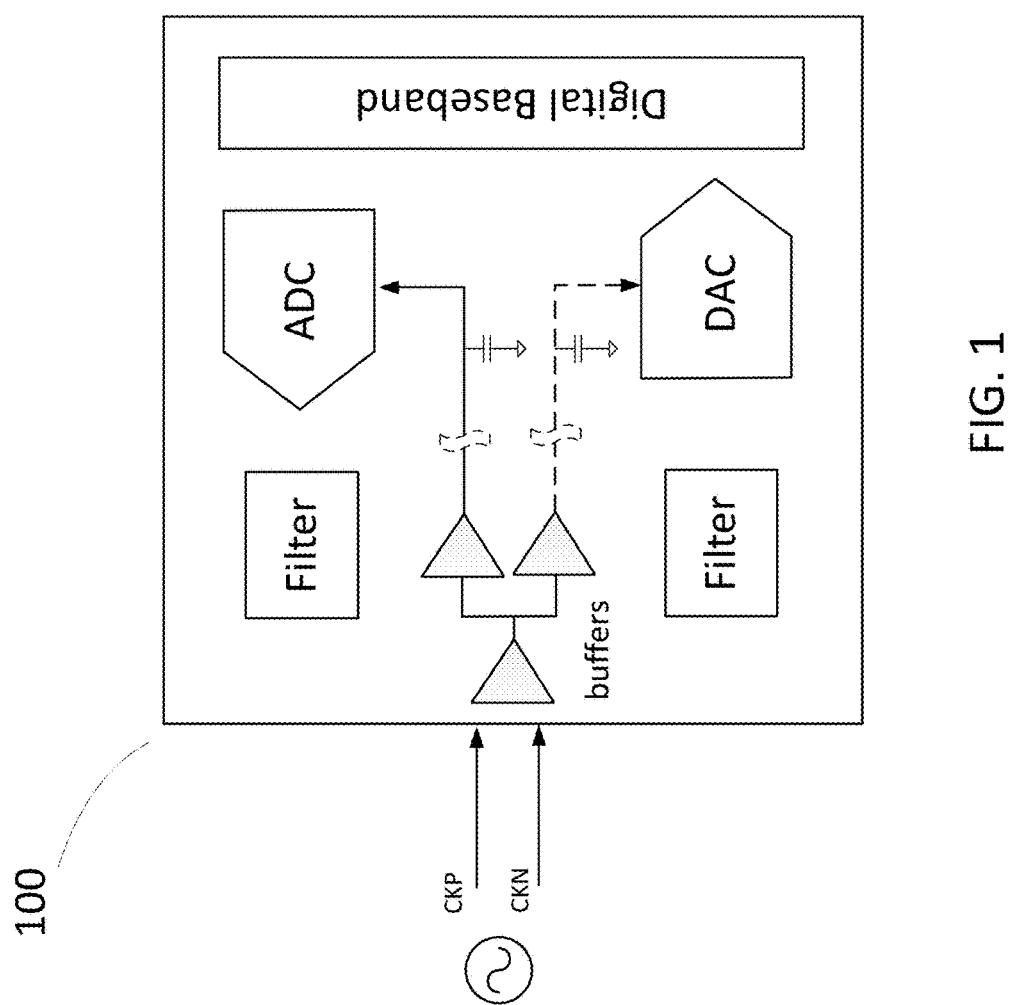
FIG. 1 illustrates an exemplary block diagram of typical system-on-a-chip integrated circuit.
Figure 2:
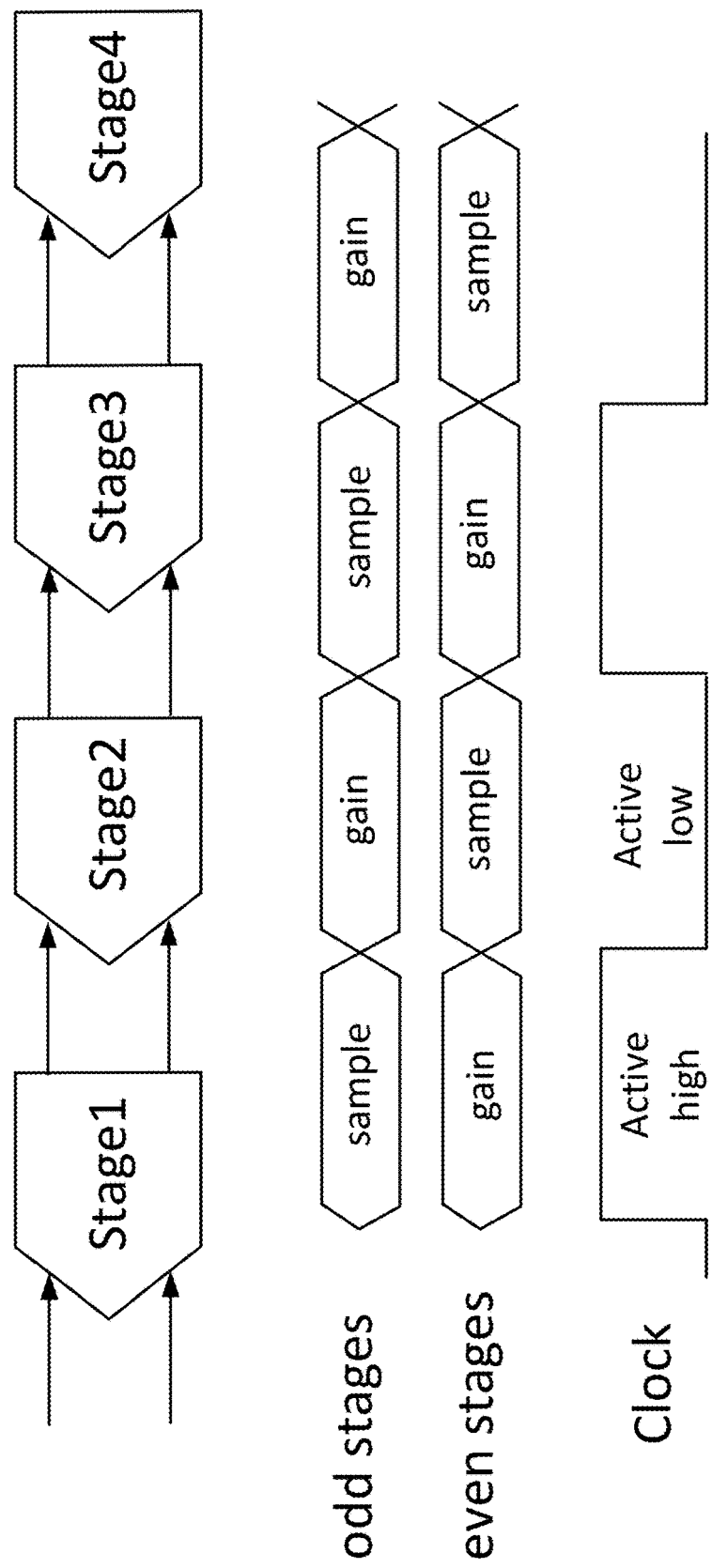
FIG. 2 shows an exemplary four-stage Pipelined ADC block diagram.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Furthermore, it is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Similarly, it is to be noticed that the term "coupled" discloses both direct and indirect coupling and should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

Figure 3A:
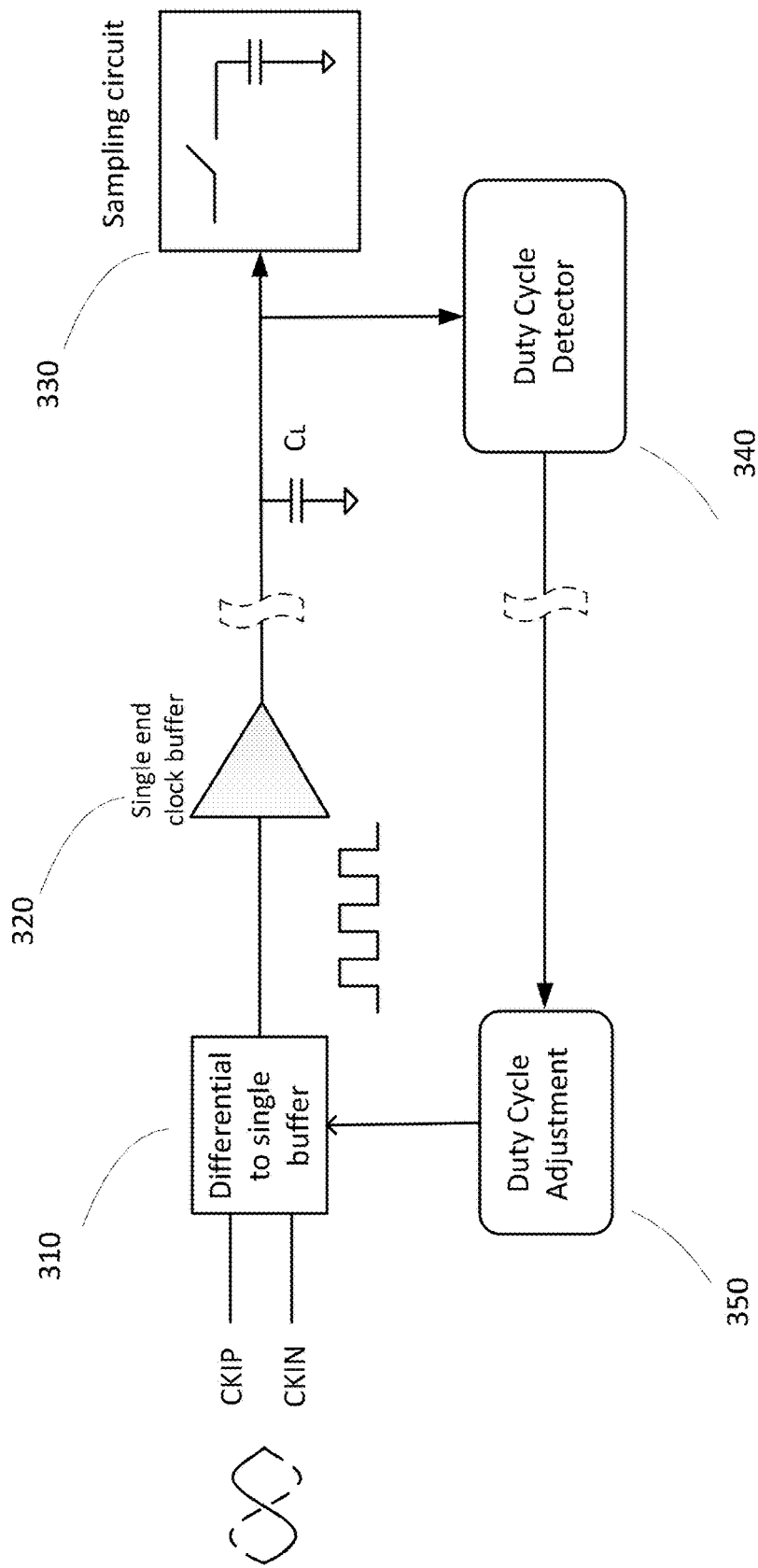
FIG. 3A shows an exemplary block diagram of differential clock buffer with programmable duty cycle.

FIG. 3A illustrates the block diagram of differential clock buffer with duty cycle programmability. It consists of differential-to-single buffer 310, single-ended clock buffer 320, sampling circuit 330, duty cycle detection 340 and duty cycle adjustment 350. Differential to single-ended buffer 310 amplifies the small input signals and convert the differential clocks to a single-ended squared clock with full swing from supply to ground. Single-ended clock buffer 320 drives a large routing capacitance due to a long distance to the sampling circuit 330. Duty cycle detection 340 detects the duty cycle information and sends it to duty cycle adjustment 350. Duty cycle adjustment 350 introduces correction current into differential-to-single buffer 310 and obtains the desired duty cycle. These five functional modules form a close loop configuration with negative feedback mechanism.

Figure 3B:
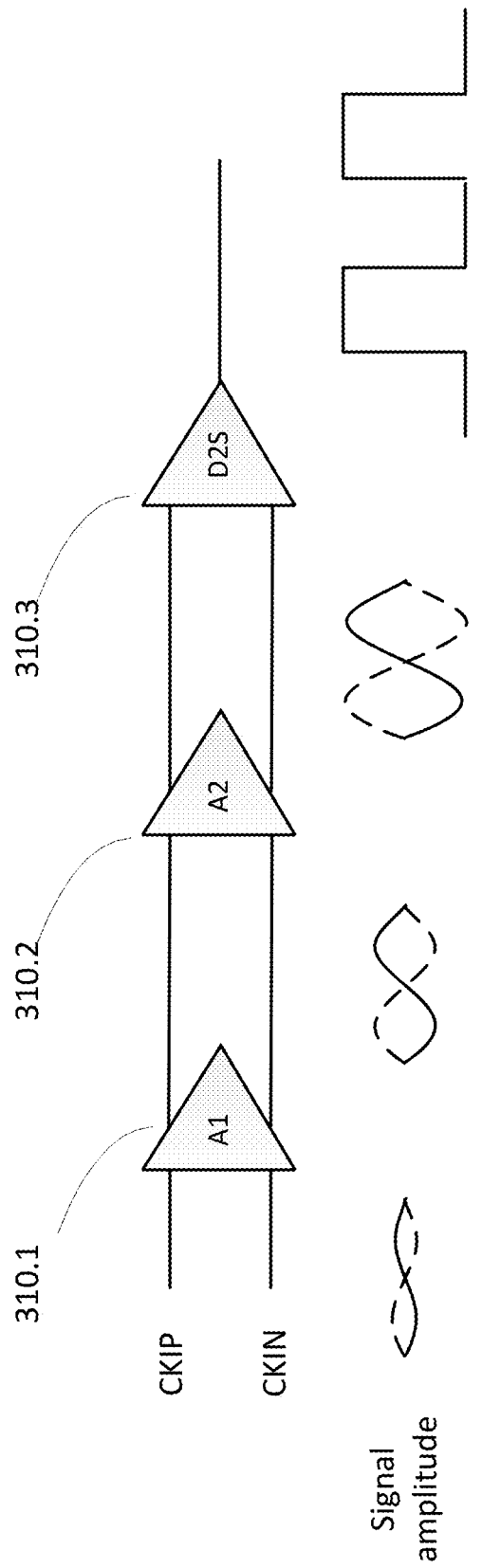
FIG. 3B is an exemplary detailed stage diagram of differential to single buffer.
Figure 4:
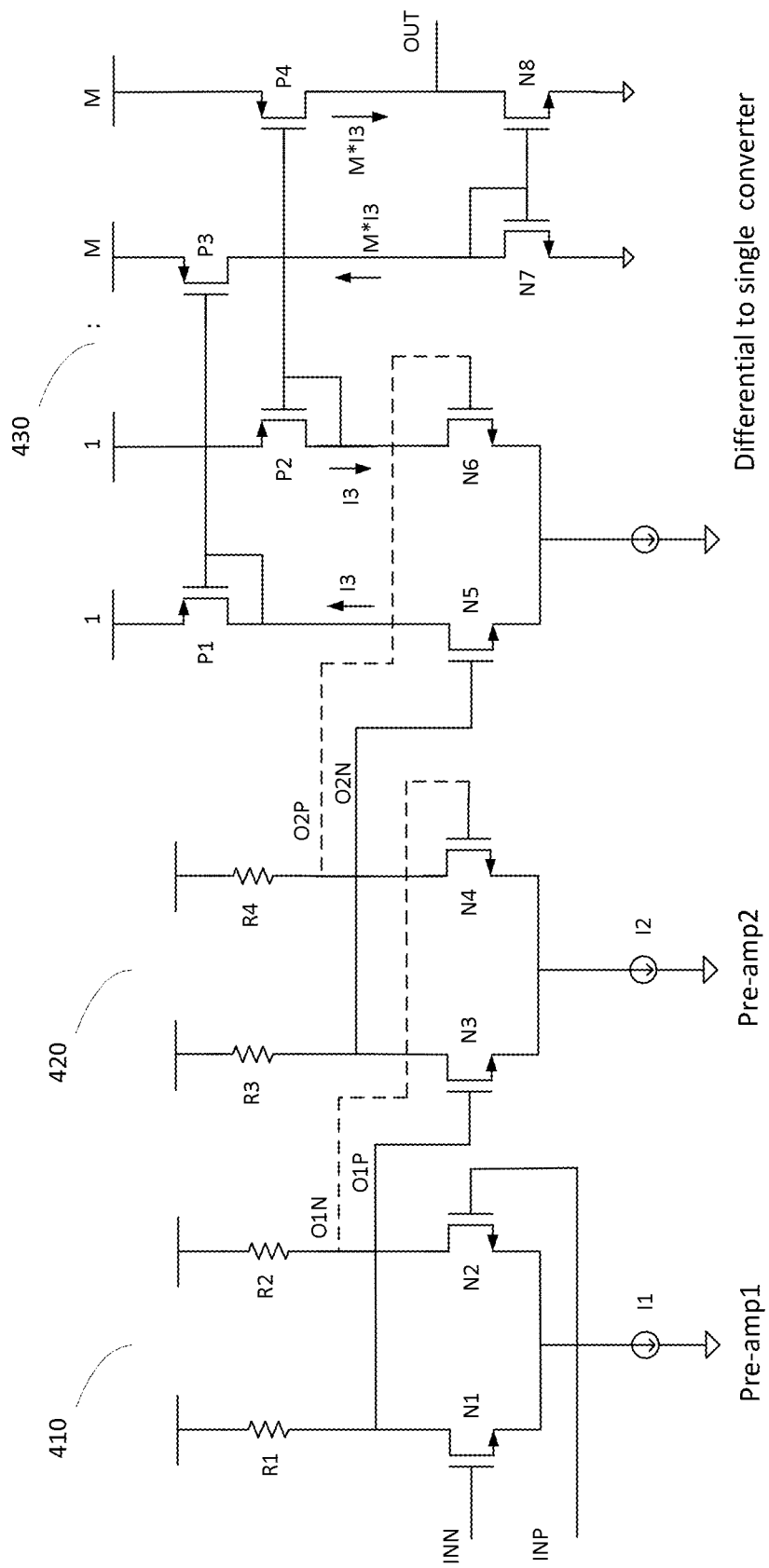
FIG. 4 shows an exemplary circuit implementation of the pre-amp and the differential to single converter.

FIG. 3B shows a detailed implementation of differential-to-single buffer 310. There are two cascading pre-amp stages 310.1, 310.2 preceding a differential to single-ended conversion (D2S) circuit 3103. The two cascading pre-amp stages amplify the small amplitude of the input differential clocks to larger amplitude. The differential clocks are subsequently converted to a single-ended clock by the differential to single converter (D2S) 310.3. The output of the differential to single converter (D2S) is a squared wave with full swing. FIG. 4 depicts the example embodiment circuit implementation of the pre-amp 410, 420 and the differential to single converter 430. In FIG. 4, N1/N2 and N3/N4 form two input differential pairs coupled to resistive load R1/R2 and R3/R4 respectively. The amplified voltage O2P/O2N of $2^{nd}$ pre-amp output is converted to a current $I_3$ by N5/N6 trans-conductance pair and the current $I_3$ is mirrored to N7/N8 pair by 1 to M ratio current mirror P1/P2/P3/P4. With two pre-amp stage cascading, the signal amplitude is increased gradually to minimize the distortion, noise and achieve good common mode rejection and good power supply rejection. Any undesired noise or distortion coupled into the clock buffer during amplification would cause unwanted modulation with the input signal at the sampling circuit and degrade the accuracy of sampling.

The clock signal becomes a squared wave at the full swing from supply to ground after the differential to single converter stage. The physical location of the differential to single stage is ideally at the chip boundary to avoid any routing that potentially causes noise coupling. However, the sampling circuit 330 such as Sample-and-hold (S&H) in ADC is usually far away from the chip boundary as illustrated in FIG. 1 and FIG. 3. The long distance between the sampling circuit 330 and the differential to single buffer 310 introduces a large routing capacitance CL as shown in FIG. 3. This situation necessitates a single-ended clock buffer 320 to drive such a capacitive loading. The rise time and fall time of the whole clock path from pre-amp to the sampling circuit has to be small in order to minimize jitter.

Figure 5:
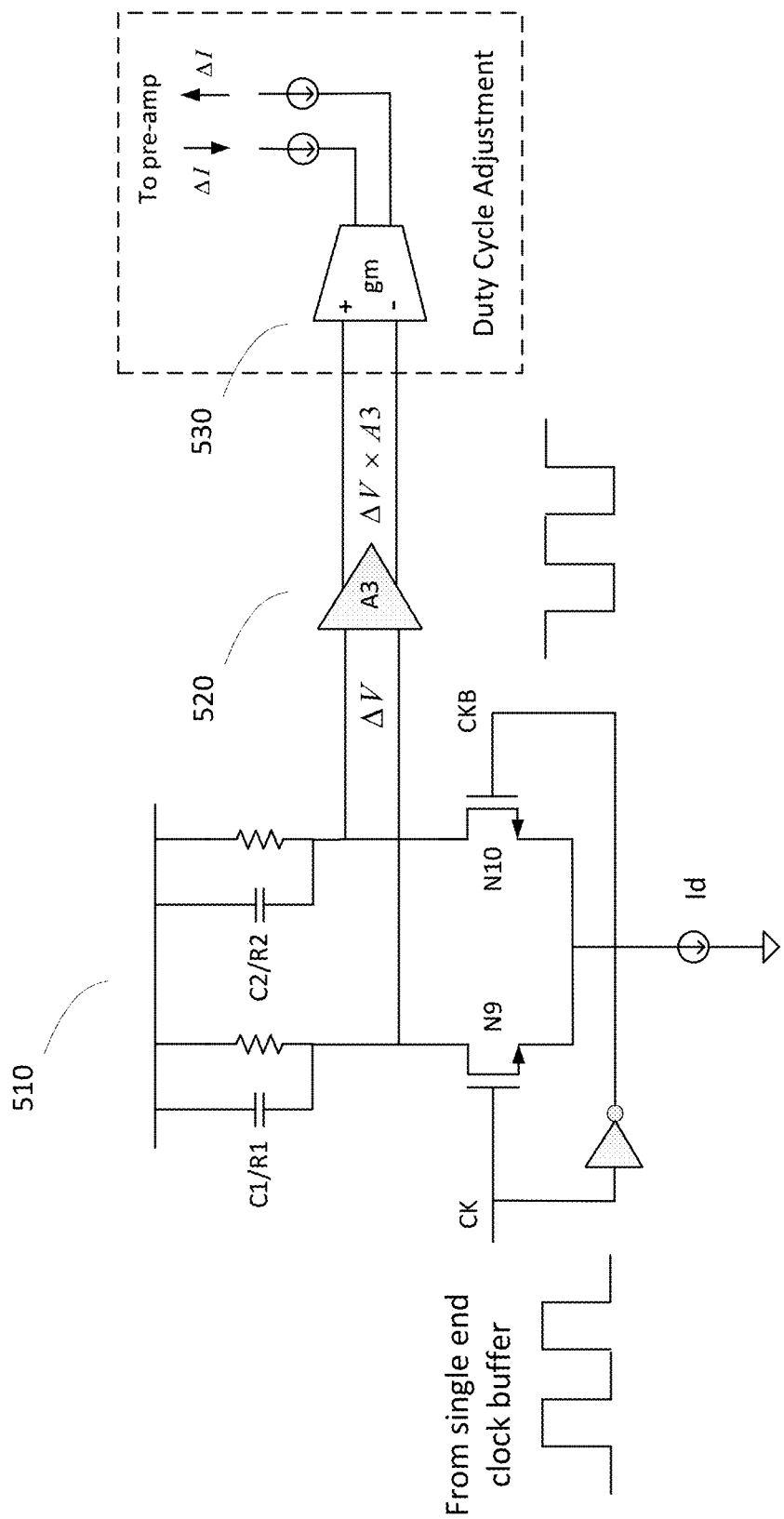
FIG. 5 illustrates an exemplary duty cycle detection implementation.

The duty cycle of the clock path depends on the buffer (usually inverter based) PFET/NFET size ratio and it also varies with process, voltage and temperature (PVT). Besides, the duty cycle changes along the long path. To obtain the accurate duty cycle information of the sampling circuit, the duty cycle detection needs to be placed near the sampling circuit. FIG. 5 shows the implementation of duty cycle detection. It consists of a differential input pair N9/N10 and the load with a resistor and capacitor in parallel. The input pair N9/N10 has opposite polarity inputs and it forms a switch pair that directs the tail current $I_d$ either into load C1/R or load C2/R2 depending on the polarity of the CK/CKB. C1/R1 and C2/R2 average the current pulse to a slow moving voltage. C1/R1 and C2/R2 work as integrators that combine the current pulses into the load for a certain time. For 50% duty cycle clock, the averaged current into C1/R1 equals the current into C2/R2 such that there is no voltage difference on load C1/R1 and C2/R2. For non-fifty percent duty cycle clock, the averaged net current into load C1/R1 is different from the net current into C2/R2. This net current difference results in a voltage difference V. This voltage difference V is then amplified by an amplifier 520 and then converted to current difference by the trans-conductance gm circuit 530 that resides in the duty cycle adjustment. The current outputs of trans-conductance gm circuit are connected to the outputs of pre-amp stage.

Figure 6:
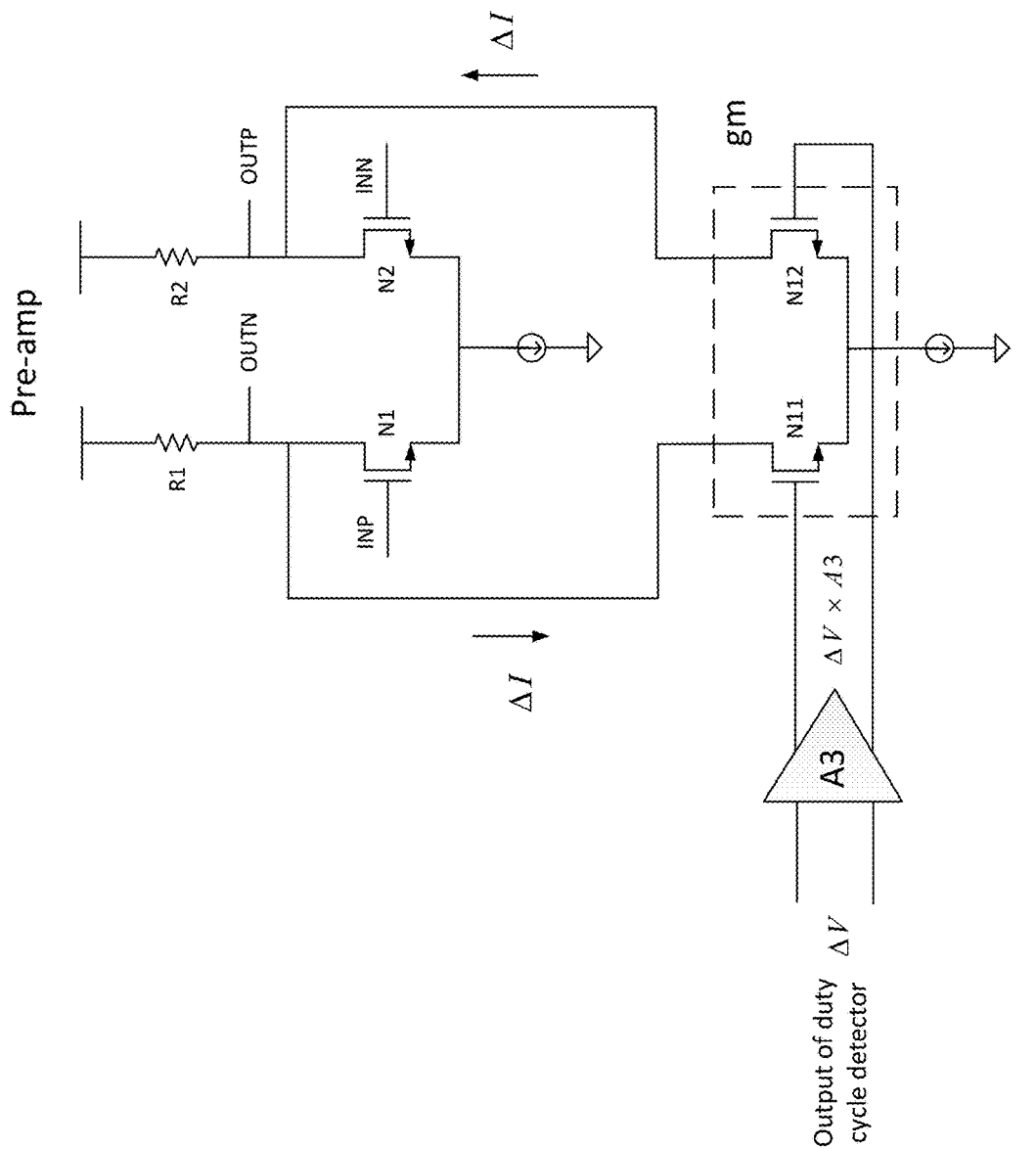
FIG. 6 shows an exemplary continuous time duty cycle adjustment implementation.

FIG. 6 illustrates the continuous time duty cycle adjustment embodiment. N11/N12 input pair acts as the trans-conductance gm circuit 530 in FIG. 5. The incurred current difference due to non-fifty percent duty cycle is fed back into pre-amp to divert the current into pre-amp's load R1 and R2. The unequal current introduces offset current and changes the duty cycle accordingly. The close loop configuration forms a negative feedback mechanism that it corrects the error and forces the duty cycle to be 50%. The duty cycle adjustment location is ideally placed near pre-amp since their outputs are connected together to produce the offset current.

Figure 7:
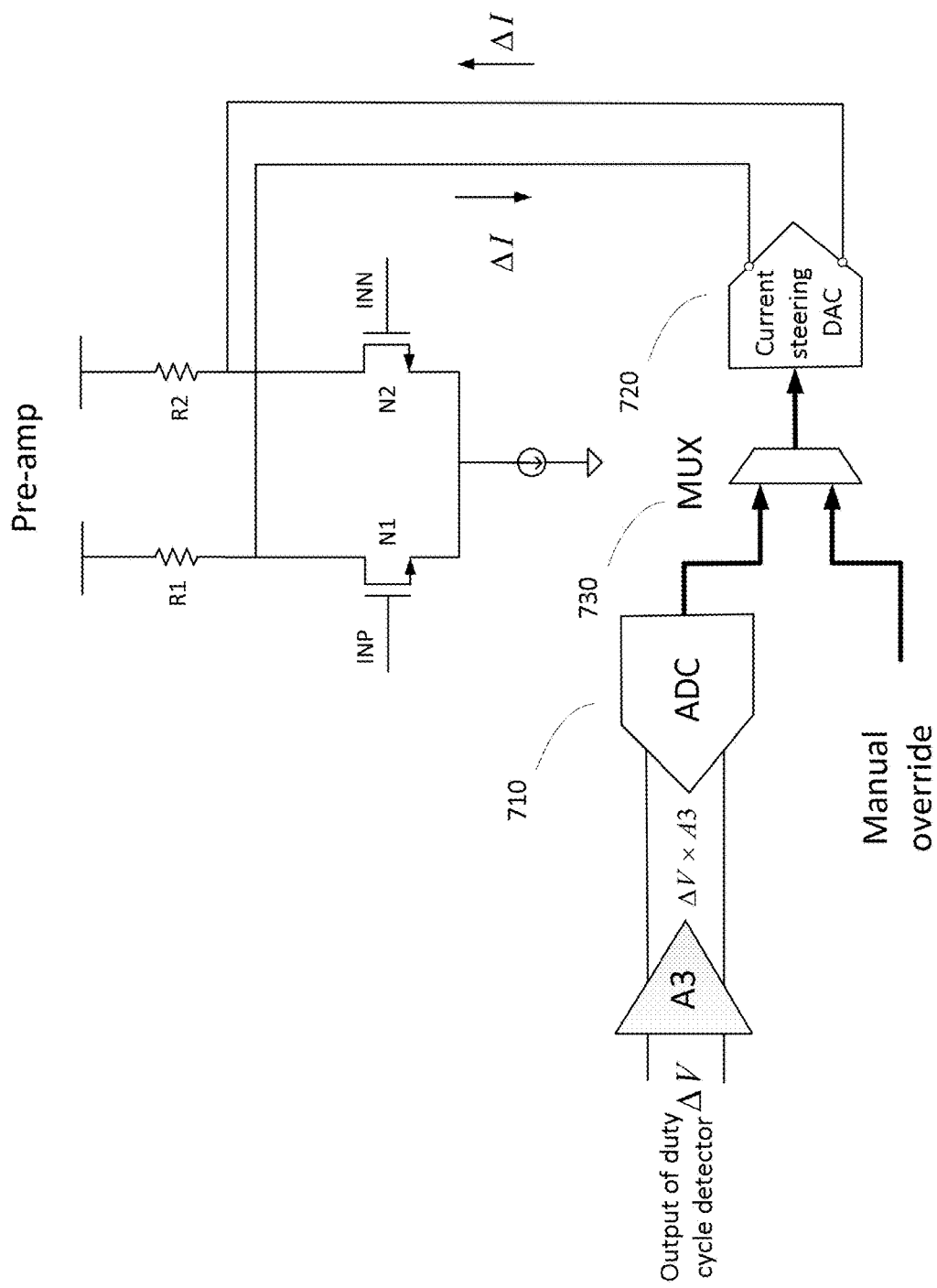
FIG. 7 shows an exemplary discrete time duty cycle adjustment implementation.

The output amplitude of duty cycle detection can be quite small even it is amplified especially when the duty cycle is close to 50%. This analog signal quality would be deteriorated due to noise coupling if the distance path between duty cycle detection and duty cycle adjustment is too long. This signal integrity concern due to long distance routing can be mitigated by inserting an ADC and DAC pair into the loop. FIG. 7 illustrates the discrete time duty cycle detection and adjustment embodiment. The amplified duty cycle detection output signal $V \times A_3$ is converted to digital bits by an ADC 710 and then the digital bits are converted back to analog waveform by current steering DAC 720. Once the interface is converted to digital bits, the long distance path is not a concern any more. Duty cycle detection is a slow averaged operation, adding a slow high resolution ADC/DAC pair into the signal loop ensures the signal integrity is not compromised due to the long routing distance. Moreover, the mux 730 preceding the DAC enables the manual override function, which allows users to program the optimal duty cycle and have the flexibility to turn on/off the duty cycle adjustment during specified time if needed.

Figure 8:
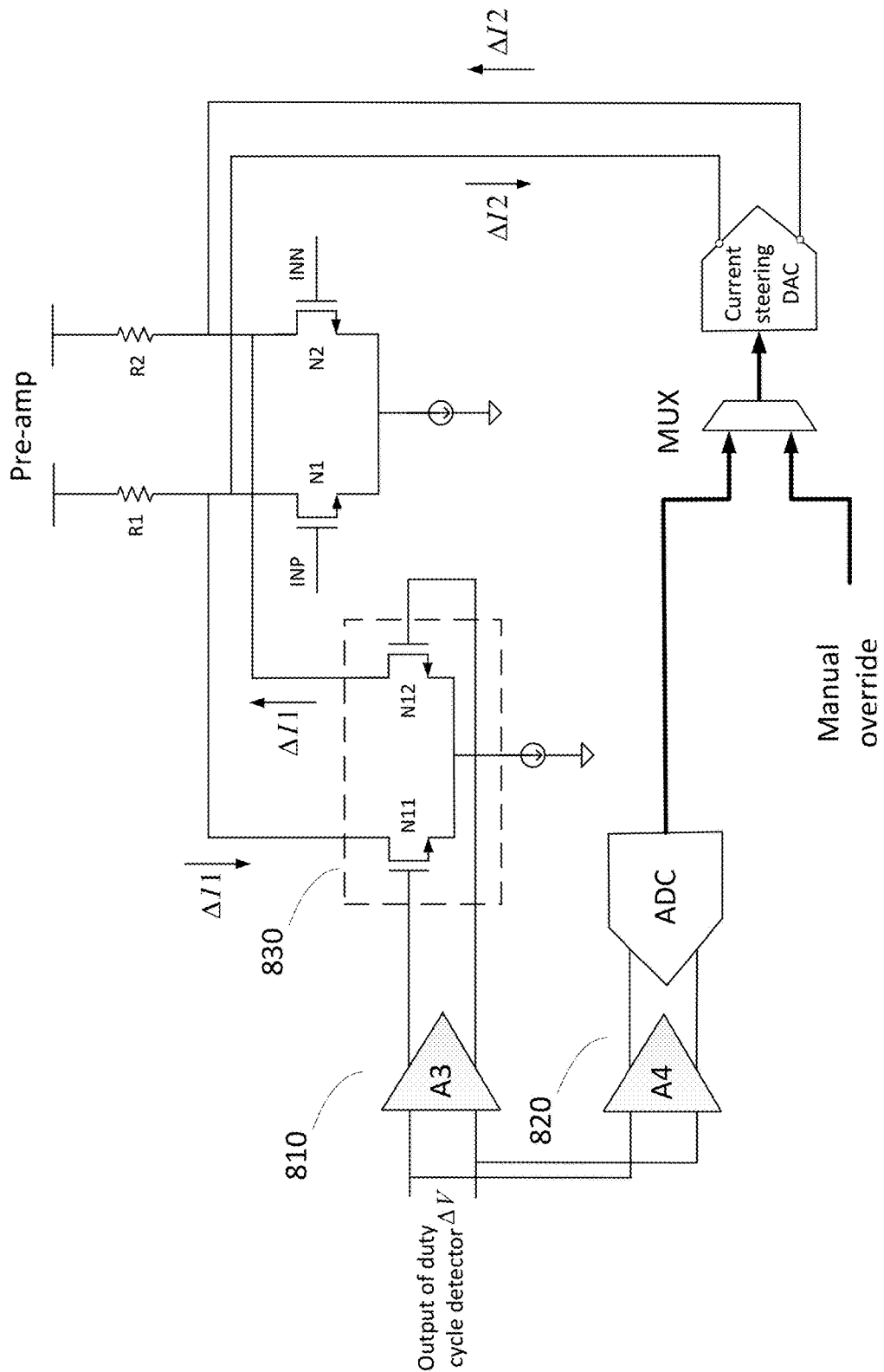
FIG. 8 shows an exemplary combined continuous time and discrete time duty cycle adjustment.

The continuous time and discrete time duty cycle adjustment can be combined into a multi-loop configuration as shown in FIG. 8. The voltage difference V of duty cycle detection output is magnified by two separate amplifiers 810 and 820 respectively. The path through amplifier 810 and gm circuit 830 is the continuous time adjustment loop. The path through amplifier 820 and ADC/DAC pair is the discrete time adjustment loop. The outputs of gm circuit 830 and DAC outputs are all connected together to the pre-amp outputs. The continuous time adjustment loop can achieve finer correction resolution or step while the discrete time adjustment loop's correction step is limited by the ADC/DAC's resolution. Two different loops can employ adjustment range independently. The total adjustment range of the duty cycle is the sum of two adjustment ranges. Besides, two adjustment loops can be disabled individually by turning off amplifier 810 and 820 respectively.

Figure 9:
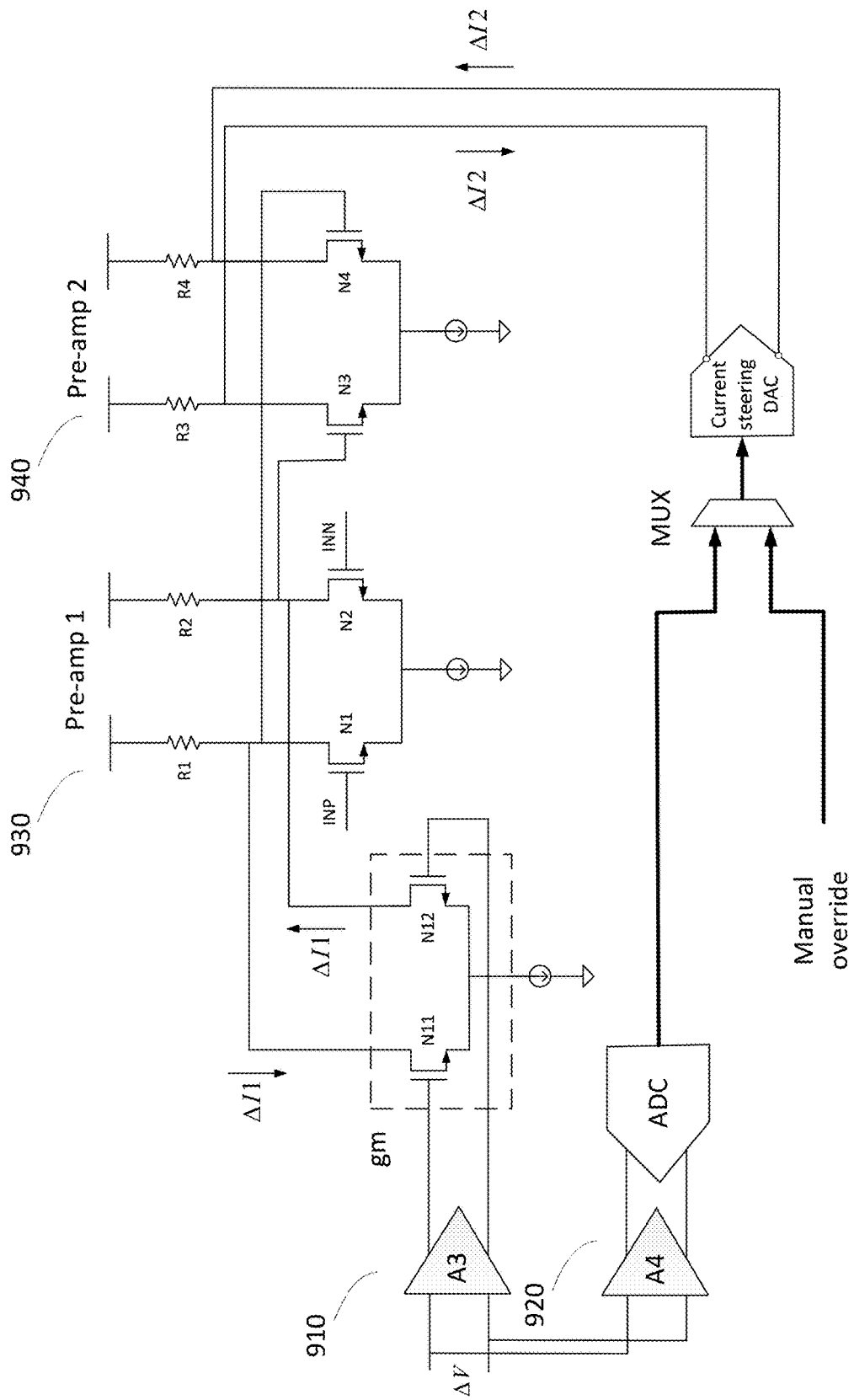
FIG. 9 is an exemplary multi-loop configuration with adjustment on separate pre-amp stages.

FIG. 9 shows the multi-loop configuration with adjustment on separate pre-amp stages. There are two adjustment loops. First continuous time adjustment loop is through amplifier 910 and gm circuit. The outputs of gin circuit are connected to outputs of the 1st pre-amp 930. The second discrete time adjustment loop is through amplifier 920 and ADC/DAC pair. The outputs of DAC are connected to the outputs of $2^{nd}$ pre-amp 940. Each adjustment loop can have different loop gain and duty cycle adjustment range. This multi-loop configuration achieves maximum flexibility of programmability on the correction resolution, range and usage on the duty cycle adjustment.

For the circuit elements and applications that employ sampling circuit such as data converters (ADC/DAC), the adjustment of clock duty cycle allow user to optimize the active time for specific stage that limits the data converter's performance. Data converter's performance is heavily dependent upon silicon's process, voltage and temperature (PVT) condition. The duty cycle adjustment can be programmed correspondingly to process, voltage and temperature (PVT) variation to enhance data converter's performance.

Embodiments of the invention may include an article such as a computer processor readable non-transitory storage medium, such as for example a memory, a disk drive, or a USB flash memory encoding, including or storing instructions, e.g., computer-executable instructions, which when executed by a processor or controller, cause the processor or controller to carry out methods disclosed herein.

The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

What is claimed is:

1. A method for performing clock duty cycle adjustment, comprising:

converting a differential clock signal to a single-ended clock signal;
buffering the single-ended clock signal with a buffer;
sampling the buffered clock signal; and
detecting a duty cycle from the buffered clock signal and adjusting the duty cycle in a closed negative feedback loop configuration, wherein the duty cycle detection comprises providing a differential input pair with opposite polarity inputs and a resistor and capacitor in parallel as a load.

2. The method of claim 1, wherein the differential to single buffering comprises multiple stage pre-amp cascading with differential to single clock conversion.

3. The method of claim 1, wherein the duty cycle adjustment comprises a voltage amplifier and trans-conductance gm circuit; the gm circuit outputs are connected to pre-amp outputs.

4. The method of claim 1, wherein physically the duty cycle detection is placed near a sampling circuit and the duty cycle adjustment is placed near the pre-amp for accurate detection and adjustment.

5. The method of claim 1, wherein the duty cycle adjustment comprises providing a voltage amplifier followed by Analog to Digital Converter (ADC) and Digital to Analog Converter (DAC), and the DAC's outputs are connected to pre-amp outputs.

6. The method of claim 1, wherein the duty cycle adjustment comprises two loops having one loop with amplifier and trans-conductance (gm) circuit and another loop with a data converter pair, wherein the outputs of two loops are connected together to pre-amp outputs.

7. The method of claim 1, wherein the duty cycle adjustment comprises two different loops, one loop with amplifier and trans-conductance gm circuit and another loop with a data converter pair, wherein the outputs of two loops are connected to two separate pre-amp outputs respectively.

8. The method of claim 1, wherein the adjustment of the clock duty cycle couples with data converters to optimize the sampling clock duty cycle for performance enhancement of data converters.

9. The method of claim 8, wherein the clock duty cycle adjustment employs two adjustment loops to achieve usage flexibility on the adjustment range and the adjustment resolution.

10. The method of claim 8, wherein the clock duty cycle adjustment is programmed correspondingly to a silicon device's process, voltage and temperature (PVT) condition for performance enhancement of data converters.

* * * * *